(12) United States Patent
Tong et al.

(10) Patent No.: US 6,713,320 B2
(45) Date of Patent: Mar. 30, 2004

(54) BUMPING PROCESS

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,227

(22) Filed: Dec. 30, 2002

(65) Prior Publication Data

US 2003/0162321 A1 Aug. 28, 2003

(30) Foreign Application Priority Data

Feb. 25, 2002 (TW) ........................................ 91103242 A

(51) Int. Cl.[7] ........................ H01L 21/48; H01L 21/44

(52) U.S. Cl. ........................ 438/109; 438/118; 438/613
(58) Field of Search ................................. 438/109, 612, 438/613, 614, 118

(56) References Cited

U.S. PATENT DOCUMENTS

| | | | | |
|---|---|---|---|---|
| 5,872,051 A | * | 2/1999 | Fallon et al. | ................ 438/616 |
| 5,925,931 A | * | 7/1999 | Yamamoto | ................... 257/737 |
| 6,307,159 B1 | * | 10/2001 | Soejima et al. | .............. 174/250 |
| 6,541,303 B2 | * | 4/2003 | Akram et al. | ................ 438/106 |

FOREIGN PATENT DOCUMENTS

JP    40 06084922    *  3/1994   ......... H01L/21/321

* cited by examiner

*Primary Examiner*—Amir Zarabian
*Assistant Examiner*—Pamela E Perkins
(74) *Attorney, Agent, or Firm*—Jiang Chyun IP Office

(57) ABSTRACT

A bumping process wherein a substrate is first provided with many electrical connections. Subsequently, the bumps on the bump transfer substrate are pressed onto the electrical connections of the substrate accompanying a heating process and then the bumps are transferred onto the electrical connections of the substrate because the adhesion characteristic between the bumps and the electrical connections is better than that between the bumps and the release layer.

20 Claims, 5 Drawing Sheets

_US 6,713,320 B2_

BUMPING PROCESS

CROSS REFERENCE TO RELATED APPLICATIONS

This application claims the priority benefit of Taiwan application serial no. 91103242, filed Feb. 25, 2002.

BACKGROUND OF THE INVENTION

1. Field of the Invention

The invention relates in general to a bumping process. More particularly, the invention relates to a bumping process where bumps are transferred onto a wafer using a bump transfer substrate with a release layer.

2. Description of the Related Art

Recently, following the changes in electronics technology with each passing day, high-tech electronic products with multi-functions have been presented to the public one after another. Within the integrated circuit industry there is a continuing effort to increase integrated circuit speed as well as device density. As a result of these efforts, there is a trend towards using the following technologies, such as ball grid array (BGA) package, flip chip (F/C) package, chip-scale package (CSP), multi-chip module (MCM) and so on, when packaging complex high-speed integrated circuits. As far as the flip chip technology is concerned, bumps are used to electrically connect a chip to a substrate, whereby the electrical distance between the chip and the substrate is relatively short to benefit increasing signal transfer speed. Besides, there can be relatively many electrical connections formed on the chip. Therefore, using bumps to connect a chip to a substrate is a main trend within the high-density package field.

FIGS. 1–4 are schematic cross-sectional views showing a conventional bumping process. Referring to FIG. 1, a wafer 100 is provided with electrical connections 102 (only one of them is shown) and a passivation layer 104. The passivation layer 104 is deposited on the surface layer of the wafer 100 to protect the wafer 100. The passivation layer 104 has openings 105 (only one of them is shown) exposing the electrical connections 102 respectively. Following, an adhesion layer 106a, a barrier layer 106b and a wettable layer 106c are sequentially formed over the wafer 100.

Next, referring to FIG. 2, over the wafer 100 is formed a photoresist layer 108 having many openings 109 (only one of them is shown) exposing the wettable layer 106c deposited on the electrical connections 102. Subsequently, an electroplating process or a screen-printing process is used to fill solder paste into the openings 109 of the photoresist layer 108 to form solder posts 110 (only one of them is shown).

Next, referring to FIG. 3, after the solder posts 110 are formed, the photoresist layer 108 is removed. Following, the adhesion layer 106a, the barrier layer 106b and the wettable layer 106c not covered by the solder posts 110, serving as etching mask, are removed. The defined adhesion layer 106a, the barrier layer 106b and the wettable layer 106c are called an under-bump-metallurgy layer 106 (UBM).

Finally, referring to FIG. 4, after the under-bump-metallurgy layer 106 is defined, a reflow process is performed to turn the solder posts 110 into ball-like shaped bumps 112.

In the above conventional bumping process, a photolithography process is performed to define the bump location on the chip. However, the photolithography process includes the complicated steps of dehydration baking, priming, photoresist-layer coating, soft-baking, exposing, post-exposure baking, developing, hard-baking, etching and so on. As a result, to define the bump location by the photolithography process is time consuming and costly.

SUMMARY OF THE INVENTION

It is an objective according to the present invention to provide a bumping process where it is not necessary to perform a photolithography process during formation of bumps onto a substrate, such as wafer, printed circuit board (PCB), carrier and so on.

To achieve the foregoing and other objectives, the present invention provides a bumping process where a bump transfer substrate is provided with a release layer on which many bumps to be transferred are provided. A substrate is provided with many electrical connections thereon. Subsequently, the bumps on the bump transfer substrate are pressed onto the electrical connections of the substrate accompanying a heating process and then the bumps are transferred onto the electrical connections of the substrate because the adhesion characteristic between the bumps and the electrical connections is better than that between the bumps and the release layer.

According to the bumping process of the present invention, such bumps are made of various material as gold, tin-lead alloy and so on, and can be transferred onto the substrate, for example, wafer, printed circuit board, carrier, etc.

If the bumps are transferred onto a wafer, the adhesion characteristic between the bumps and the electrical connections on the wafer should be better than that between the bumps and the release layer.

If the bumps are transferred onto a printed circuit board or onto a carrier, the adhesion characteristic between the bumps and the electrical connections on the printed circuit board or on the carrier should be better than that between the bumps and the release layer.

According to the bumping process of the present invention, the bumps have a bad adhesion onto the release layer on the bump transfer substrate, wherein the material of the release layer is, for example, chromium.

According to the bumping process of the present invention, after the bumps are transferred onto the electrical connections of the substrate, a reflow process is performed.

Both the foregoing general description and the following detailed description are exemplary and explanatory only and are not restrictive of the invention, as claimed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
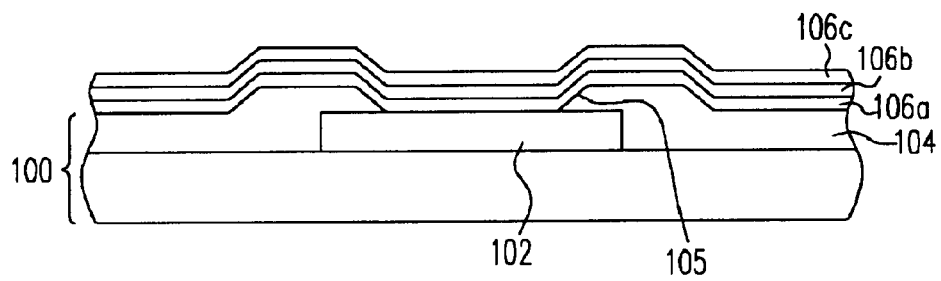
FIGS. 1–4 are schematic cross-sectional views showing a conventional bumping process.
Figure 2:
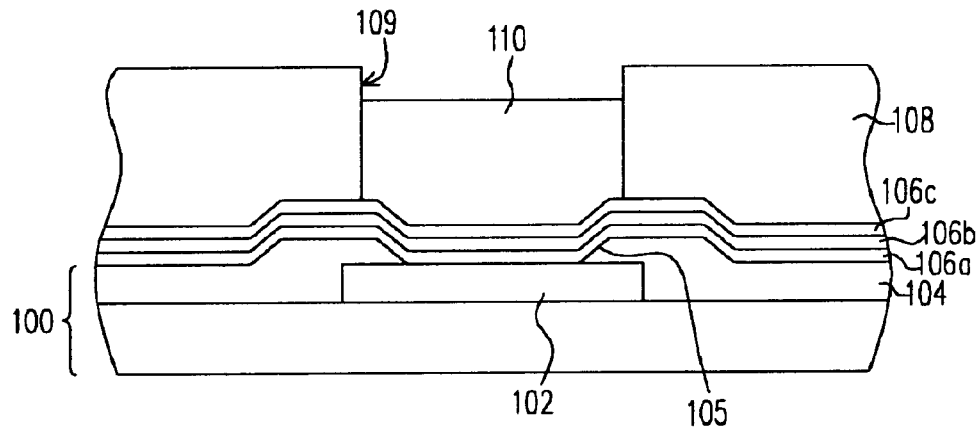
Figure 3:
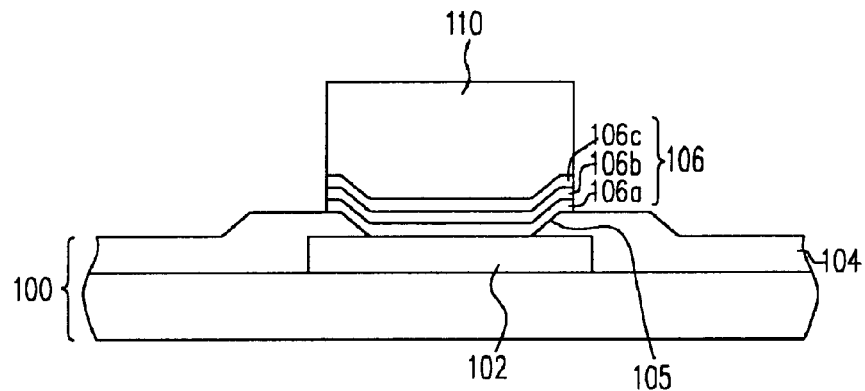
Figure 4:
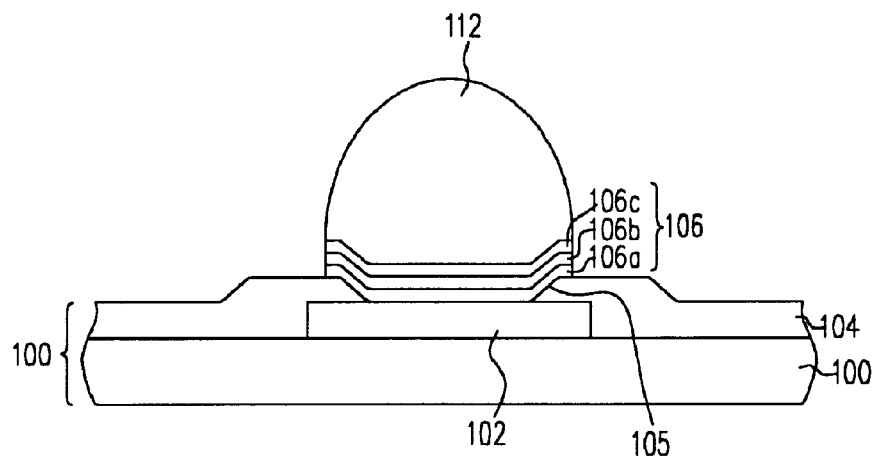
Figure 5:
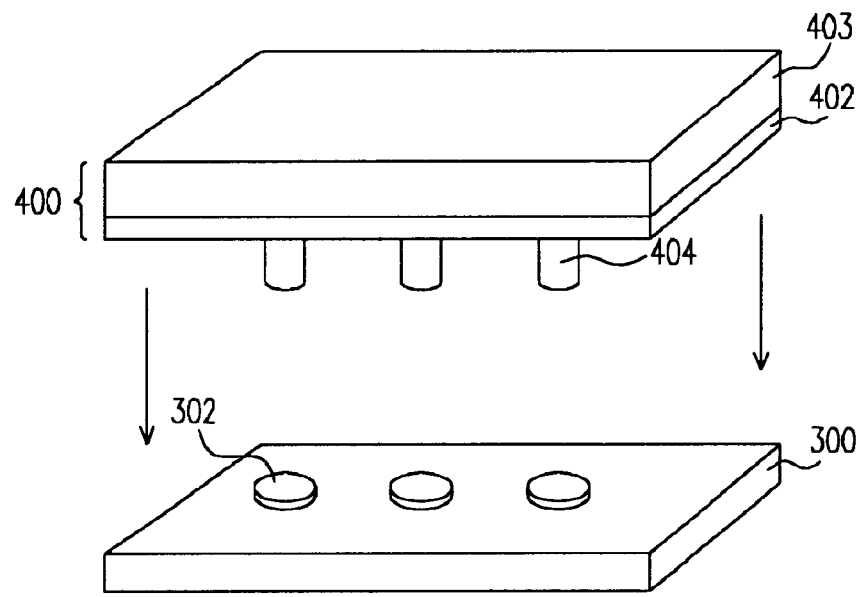
FIG. 5 and FIGS. 8–10 are schematic cross-sectional views showing a bumping process according to a preferred embodiment of the present invention.
Figure 6:
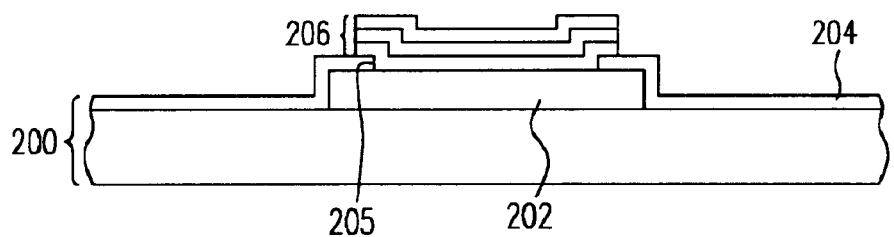
FIG. 6 and FIG. 7 are schematic cross-sectional views showing a wafer according to a preferred embodiment of the present invention.
Figure 7:
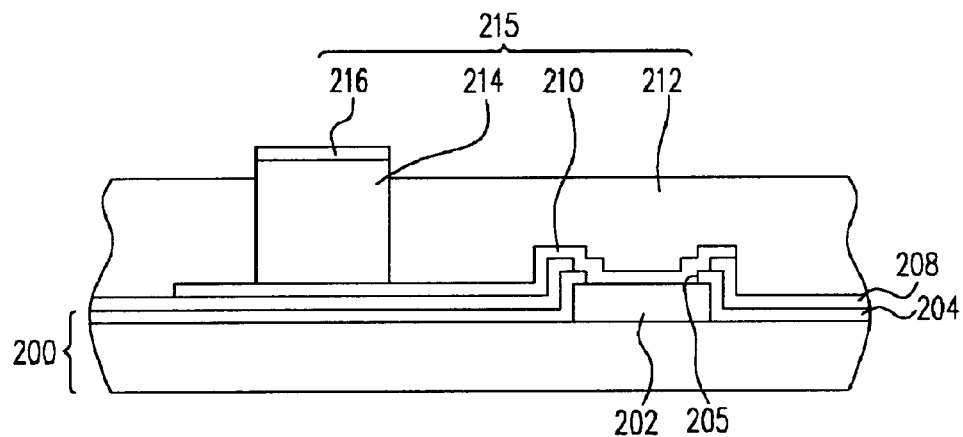

Referring to FIGS. 5–10, FIG. 5 and FIGS. 8–10 are schematic cross-sectional views showing a bumping process according to a preferred embodiment of the present invention; FIG. 6 and FIG. 7 are schematic cross-sectional views showing a wafer according to a preferred embodiment of the present invention. First, referring to FIG. 5, a substrate 300 is provided with many electrical connections 302 thereon. The substrate 300 is, for example, wafer, printed circuit board, carrier and so forth. Besides, a bump transfer substrate 400 is provided with a release layer 402 and a flat board 403. The release layer 402 is formed on flat board 403. There are many bumps 404 formed on the release layer 402. The material of the bumps 404 is, for example, gold, tin-lead alloy, etc. The material of the release layer 402 is, for example, chromium, titanium, titanium-wolfram alloy, etc. The material of the flat board 403 is, for example, silicon. The bumps 404 are easily separated from the release layer 402 due to the bad adhesion characteristic between the bumps 404 and the release layer 402.

Referring to both FIG. 5 and FIG. 6, the substrate 300 (shown in FIG. 5) is, for example, wafer, printed circuit board, carrier and so on. As shown in FIG. 6, illustrating a wafer 200, the wafer 200 is provided with many electrical connections 202 (only one of them is shown) and a passivation layer 204. The passivation layer 204 is formed on the surface of the wafer 200 to protect the wafer 200 and has openings 205 (only shown one of them is shown) exposing the electrical connections 202 respectively. An under-bump-metallurgy layer 206 is formed onto the electrical connections 202 of the wafer 200. The substrate 300 shown in FIG. 5 is composed of the wafer 200 and the under-bump-metallurgy layer 206, wherein the under-bump-metallurgy layer 206 serves as electrical connections of the wafer 200. The material of the under-bump-metallurgy layer 206 includes gold, copper, nickel-vanadium alloy, titanium-wolfram alloy, aluminum and so on. It should be noted that the adhesion characteristic between the under-bump-metallurgy layer 206 and the bumps 404 is in a good condition. Therefore, in the case when the adhesion characteristic between the bumps 404 and the under-bump-metallurgy layer 206 is better than that between the bumps 404 and the release layer 402, the bumps 404 can be transferred onto the under-bump-metallurgy layer 206.

Referring to FIG. 7, illustrating a wafer 200 after redistribution, the wafer 200 is provided with many electrical connections 202 (only one of them is shown), a passivation layer 204 and a redistribution layer 215. The passivation layer 204 has openings 205 (only shown one of them is shown) exposing the electrical connections 202 respectively. Optionally, an insulation layer 208, such as silicon-nitride or poliimide, is formed on the passivation layer 204. The redistribution layer 215 is formed on the insulation layer 208 and is electrically connected with the electrical connections 202 of the wafer 200. The substrate 300 shown in FIG. 5 is composed of the wafer 200, the insulation layer 208 and the redistribution layer 215.

Next, referring to both FIG. 5 and FIG. 7, the redistribution layer 215 is composed of a redistributing-trace layer 210, a dielectric layer 212, many electrically conductive posts 214 (only one of them is shown) and an electrically conductive layer 216. The redistributing-trace layer 210 is formed on the insulation layer 208 and is electrically connected with the wafer 200. The dielectric layer 212 covers the redistributing-trace layer 210, the electrically conductive posts 214 and the insulation layer 208. The electrically conductive posts 214 can be, for example, copper. An end of each electrically conductive post 214 is connected with the redistributing-trace layer 215 and the other end of each electrically conductive post 214 is exposed to the outside. The electrically conductive layer 216 is formed on the exposed-to-outside end of the electrically conductive posts 214. The electrically conductive layer 216 acts as electrical connections of the wafer 200 and can be electrically connected with an outside circuit. The electrically conductive layer 216, for example, Nickel, formed on the electrically conductive posts 214 corresponds to the electrical connections 302 of the substrate 300, as shown in FIG. 5. Therefore, in the case when the adhesion characteristic between the bumps 404 and the electrically conductive layer 216 is better than that between the bumps 404 and the release layer 402, the bumps 404 can be transferred onto the electrically conductive layer 216.

Figure 8:
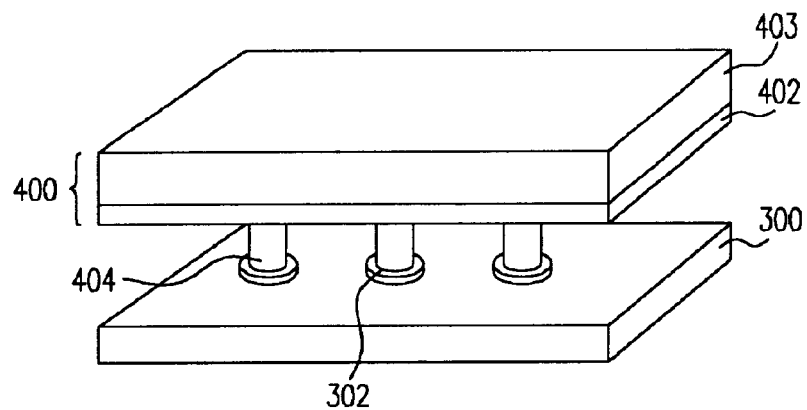

Following, referring to FIG. 8, the bump transfer substrate 400 is moved over the substrate 300 such that the bumps 404 on the bump transfer substrate 400 can be pressed onto the electrical connections 302 of the substrate 300 accompanying a heating process and then the bumps 404 can be transferred from the release layer 402 onto the electrical connections 302 of the substrate 300. The electrical connections 302 can be, for example, an under-bump-metallurgy layer 206, as shown in FIG. 6, or an electrically conductive layer 216, as shown in FIG. 7.

Besides, after the step of transferring the bumps 404 from the release layer 402 of the bump transfer substrate 400, bumps are again formed on the release layer 402 of the bump transfer substrate 400. The bump transfer substrate 400 is reusable. The process of fabricating the bumps 404 onto the bump transfer substrate 400 includes the steps of coating a photoresist layer, exposing, developing, forming bumps by electroplating or screen-printing, and so on. These steps can be easily achieved by those skilled in the art and, thus, the related description is not repeated herein.

Figure 9:
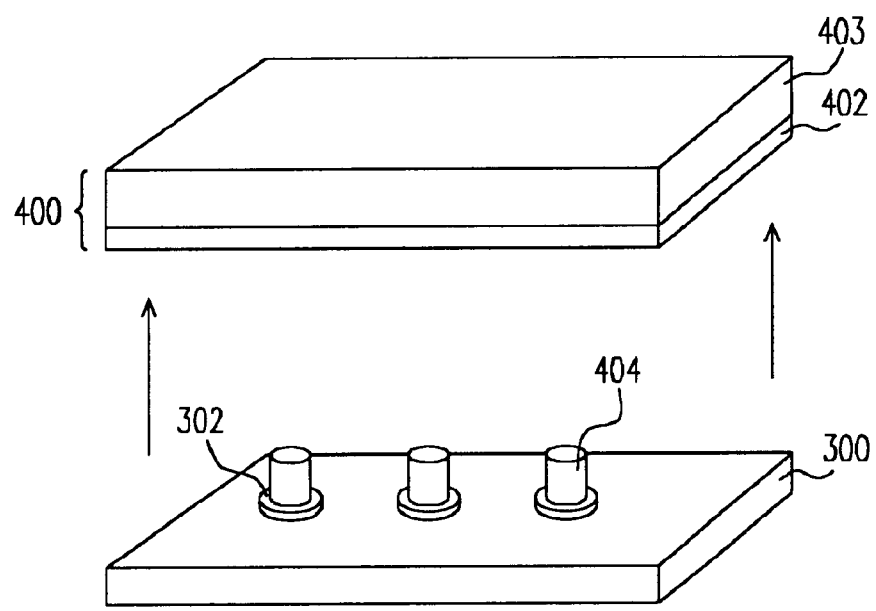

Next, referring to FIG. 9, the bump transfer substrate 400 is separated from the substrate 300. Because the adhesion characteristic between the bumps 404 and the electrical connections 302 is better than that between the bumps 404 and the release layer 402, the bumps 404 can be readily transferred onto the electrical connections 302 of the substrate 300 after the above pressing and heating step.

Figure 10:
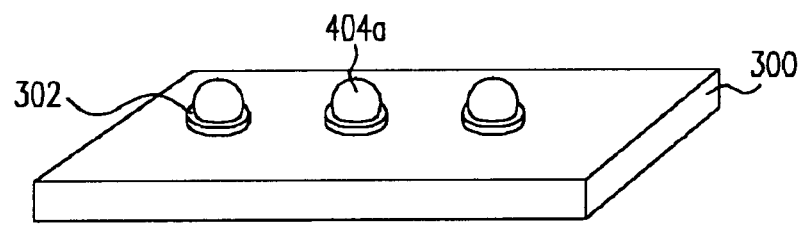

Finally, referring to FIG. 10, after the step of transferring the bumps 404 onto the electrical connections 302 of the substrate 300, a reflow process can be selectively performed according to the material of the bumps 404. If the material of the bumps 404 is tin-lead alloy, a reflow process can be preformed to form ball-like shaped bumps. If the material of the bumps 404 is gold, the reflow process can be omitted.

To sum up, the present invention has the following advantages:

1. According to the bumping process of the present invention, bumps are formed on a substrate, such as a wafer, printed circuit board, or carrier, under the condition that coating a photoresist layer on the wafer can be omitted.

2. According to the bumping process of the present invention, the bump transfer substrate is reusable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bumping process, comprising:
   providing a substrate with a plurality of electrical connections;
   providing a bump transfer substrate with a release layer, wherein the release layer comprises one selected from the group consisting of chromium, titanium, and titanium-wolfram alloy;
   forming bumps onto the release layer of the bump transfer substrate;
   attaching the bumps formed on the release layer onto the electrical connections of the substrate; and
   separating the bump transfer substrate from the bumps.

2. The bumping process according to claim 1, wherein the substrate includes a wafer and an under-bump-metallurgy layer formed over the wafer, the under-bump-metallurgy layer serving as the electrical connections of the substrate.

3. The bumping process according to claim 2, wherein the material of the under-bump-metallurgy layer at least includes gold, copper, nickel-vanadium alloy, titanium-wolfram alloy or aluminum.

4. The bumping process according to claim 2, wherein when the bumps formed on the release layer are attached onto the under-bump-metallurgy layer of the substrate, the adhesion characteristic between the under-bump-metallurgy layer and the bumps is better than that between the release layer and the bumps.

5. The bumping process according to claim 1, wherein the substrate comprises a wafer and a redistribution layer formed over the wafer, the redistribution layer including an electrically conductive layer that serves as the electrical connections of the substrate.

6. The bumping process according to claim 5, wherein the redistribution layer further includes a redistributing-trace layer, a dielectric layer, and a plurality of electrically conductive posts, the redistributing-trace layer formed over the wafer, each electrically conductive post having an end connected with the redistributing-trace layer and the other end connected with the electrically conductive layer, the dielectric layer formed over the wafer and covering the electrically conductive posts and the redistributing-trace layer.

7. The bumping process according to claim 5, wherein when the bumps formed on the release layer are attached onto the electrically conductive layer of the redistribution layer, the adhesion characteristic between the electrically conductive layer and the bumps is better than that between the release layer and the bumps.

8. The bumping process according to claim 1, wherein the bump transfer substrate further includes a flat board made of silicon, the release layer formed on the flat board.

9. The bumping process according to claim 1, wherein the material of the bumps is gold or tin-lead alloy.

10. The bumping process according to claim 1, wherein an electroplating process or a screen-printing process is used to form the bumps onto the release layer of the bump transfer substrate.

11. The bumping process according to claim 1, wherein the bumps formed on the release layer are attached onto the electrical connections of the substrate accompanying a heating process and a pressing process.

12. The bumping process according to claim 1, wherein after the bump transfer substrate is separated from the bumps, a reflow process is performed.

13. A bumping process, comprising;
   forming at least one bump onto a bump transfer substrate, wherein the bump transfer substrate comprises a flat board and a release layer, and the release layer comprises one selected from the group consisting of chromium, titanium, and titanium-wolfram alloy;
   attaching the bump formed on the bump transfer substrate onto an electrical connection; and
   separating the bump transfer substrate from the bump.

14. The bumping process according to claim 13, wherein the material of the electrical connection at least includes gold, copper, nickel-vanadium alloy, titanium-wolfram alloy or aluminum.

15. The bumping process according to claim 13, wherein when the bump formed on the bump transfer substrate is attached onto the electrical connection, the adhesion characteristic between the electrical connection and the bump is better than that between the bump transfer substrate and the bump.

16. The bumping process according to claim 13, wherein the flat board is made of silicon.

17. The bumping process according to claim 13, wherein the material of the bump is gold or tin-lead alloy.

18. The bumping process according to claim 13, wherein an electroplating process or screen-printing process is used to form the bump onto the bump transfer substrate.

19. The bumping process according to claim 13, wherein the bump formed on the bump transfer substrate is attached onto the electrical connection accompanying a heating process and a pressing process.

20. The bumping process according to claim 13, wherein after the bump transfer substrate is separated from the bump, a reflow process is performed.

* * * * *